United States Patent [19]

Hemings et al.

[11] Patent Number: 5,144,406
[45] Date of Patent: Sep. 1, 1992

[54] DIODE DEVICES AND ACTIVE MATRIX ADDRESSED DISPLAY DEVICES INCORPORATING THEM

[75] Inventors: Michael C. Hemings, Eindhoven, Netherlands; John M. Shannon, Whyteleafe, England

[73] Assignee: U.S. Philips Corporation, New York, N.Y.

[21] Appl. No.: 608,419

[22] Filed: Nov. 2, 1990

[30] Foreign Application Priority Data

Nov. 24, 1989 [GB] United Kingdom ............... 8926582

[51] Int. Cl.⁵ .......................................... H01L 29/34
[52] U.S. Cl. .......................................... 357/54; 357/2; 357/4; 357/17; 357/45; 357/52; 357/58
[58] Field of Search ................ 357/2, 4, 17, 30, 45, 357/52, 54, 58

[56] References Cited

U.S. PATENT DOCUMENTS 4,827,117 5/1989 Uchida et al. ..................... 357/2
4,901,133 2/1990 Curran et al. ..................... 357/2

Primary Examiner—Edward J. Wojciechowicz
Attorney, Agent, or Firm—John C. Fox

[57] ABSTRACT

A thin diode device comprises a diode structure (14), for example an amorphous silicon p-i-n structure, carried on a substrate (12), a pair of conductive layers (16,20) contacting the opposing sides of the structure, and passivating material surrounding the structure which comprises an insulating layer (22) adjacent the structure and a light-absorbing semi-insulating semiconductor layer (24), for example comprising amorphous silicon material, over the insulating layer to reduce photocurrent produced in the diode structure due to incident light. The diode devices are particularly suited for use in an active matrix addressed liquid crystal display device having an array of display elements (30), the devices serving as switches, for example in a diode ring configuration, connected in series between respective display element electrodes and associate address conductors (32).

39 Claims, 2 Drawing Sheets

DIODE DEVICES AND ACTIVE MATRIX ADDRESSED DISPLAY DEVICES INCORPORATING THEM

BACKGROUND OF THE INVENTION

This invention relates to diode devices and particularly to thin film diode devices formed on a supporting substrate. The invention relates also to matrix display devices, such as liquid crystal display devices, in which diode devices are used for actively addressing individual display elements.

An example of an active matrix addressed liquid crystal display device using diode devices is known from GB-A-2144266. The diode devices serve to control the application of drive voltages to the display elements and to isolate each display element from the others. In the described arrangement, a diode ring comprising two sets of series connected diode devices coupled in parallel with opposing polarities is provided for each display element, the diode ring being connected between an address conductor and an electrode of the display element. However, other diode configurations, such as back to back diodes, can be employed. Further examples of diode addressed display devices are given in EP-A-0166948 and GB-A-2129183. The use of diode devices as non-linear threshold elements for such purposes offers certain advantages over the more conventionally used thin film transistors (TFTs) in view of their comparative simplicity, and hence ease of fabrication. Moreover, the need for providing crossing sets of address conductors can be avoided by using a two terminal device approach.

A typical diode device, as described for example in EP-A-0166948, comprises a layer of semiconductor material, more particularly amorphous silicon, suitably doped to provide a p-i-n layered structure diode configuration which is sandwiched between two contact layers. More precisely, in a described embodiment, a first conductive layer, for connection with either a display element electrode or an address conductor, is carried on an insulating substrate and covered by a semiconductor layer which is formed with p-i-n sub-layers extending parallel to the substrate. This structure is covered with an insulating oxide layer. A window is provided in this layer over the upper side of the p-i-n layered structure and a further conductive layer is disposed over the upper side to provide a contact extending through the window onto the exposed sub-layer of the semiconductor layer. The diode device's structure is completed by a covering passivation layer of silicon oxide or silicon nitride.

In order to perform their desired function as display element control devices most effectively, the diode devices should have a low reverse current characteristic. However, the semiconductor materials, such as amorphous silicon, typically used in these diode devices exhibit light sensitivity and if subjected to light a photocurrent is generated which degrades (increases) the reverse current. With display devices such as LC devices that require illumination to operate, photocurrent effects in the diode devices are obviously undesirable. In the aforementioned known diode devices, reliance is placed on the two contact layers to shield the semiconductor layer to a certain extent from light, the contact materials to this end preferably being of metal. However, the extent to which the semiconductor layer is covered in this way should be limited if parasitic capacitance effects are to be avoided.

OBJECTS AND SUMMARY OF THE INVENTION

It is an object of the present invention to provide an improved diode device suitable for use in an active matrix display device, in which in use undesired photocurrents are reduced.

According to a first aspect of the present invention there is provided a thin film diode device comprising on a substrate a first conductive layer, a diode structure and a second conductive layer, the first and second conductive layers contacting opposing surfaces of the diode structure, and passivation material surrounding the diode structure and comprising a layer of insulating material, which is characterised in that the passivation material further includes a layer of semi-insulating semiconductor material, the layer of insulating material extending between the diode structure and the semi-insulating semiconductor layer.

The diode structure may be of amorphous semiconductor material, preferably amorphous silicon, and in the form of a p-i-n structure, a p-n structure, an n-i-n structure, or other known variations such as those for example in which the intrinsic layer is replaced by a lightly doped p or n type layer or of the MIS type. Moreover, the diode structure may comprise a multilayer structure comprising two, or more, diode elements stacked in series, as is known per se.

Semi-insulating semiconductor material can be regarded generally as equivalent to intrinsic, or undoped, semiconductor material, or as a wide band gap semiconductor which is undoped.

As a result of the provision of the semi-insulating semiconductor material, photocurrent effects in the diode structure, and more especially in an intrinsic semiconductor layer thereof if present, are prevented or at least substantially reduced.

The semi-insulating semiconductor material serves to absorb visible light of wavelengths otherwise likely to produce photocurrents in the diode structure. This material is also sufficiently insulative to provide an adequate passivating function in conjunction with the insulating layer to isolate electrically the diode structure. Moreover, the semi-insulating semiconductor material does not produce any significant band bending, that is, inversion or accumulation layers in the diode structure.

The semi-insulating semiconductor material may comprise, for example, amorphous silicon or amorphous germanium. Alternatively, undoped polysilicon material or another wide band gap semiconductor material could be used. Preferably, the material of the semi-insulating semiconductor layer is the same as that used for the diode structure. Thus, for an amorphous silicon diode structure, for example a p-i-n structure in which the outer individual sub-layers are defined by suitable doping, the semi-insulating semiconductor material comprises undoped amorphous silicon. This leads to simplified fabrication due to commonality of component materials. Further, because the semi-insulating semiconductor layer is of the same type of material as is used in the diode structure, this layer will demonstrate similar absorption characteristics and hence will tend to absorb particularly that light which would otherwise have been absorbed in the diode structure causing photocurrents.

Preferably the conductive layers and the semi-insulating semiconductor layer comprise opaque material and together surround substantially completely the diode structure so that all surface areas of the diode structure are effectively covered and protected from incident light either by the conductive material or the semi-insulating semiconductor material.

The semi-insulating semiconductor material need not extend completely over the diode structure on the substrate. In a preferred embodiment of the diode device, the first conductive layer extends over the surface of the substrate and the device structure and the second conductive layer overlies the first conductive layer. The second conductive, or upper, layer provided on the diode structure surface remote from the substrate can be formed from an opaque conductive material, for example a metal such as aluminium or chromium, to serve as a light shield to that region of the diode structure. This upper conductive layer may be provided with an integrally formed connecting track which extends over the side of the diode structure towards the substrate. Similarly the first, or lower, conductive layer, situated on the substrate underlying and preferably co-extensive with the diode structure, can also be formed of opaque conductive material, for example tungsten, so as to shield the diode structure from light coming through the substrate.

The insulating layer, comprising for example silicon nitride, silicon dioxide, polyimide or other suitable material, may be deposited directly on the surface of the diode structure and the semi-insulating semiconductor material provided directly on the insulative layer.

In one embodiment, the semi-insulating semiconductor and insulating material layers extend over the upper and side surfaces of the diode structure and a metal contact layer is provided which extends through a window in these layers adjacent the upper surface of diode structure to contact electrically with the diode structure. The metal contact layer may constitute the aforementioned second conductive layer or, alternatively, the second conductive layer may be provided as a separate layer formed over the upper surface of the diode structure and over which the insulative material and the semi-insulative semiconductor material extend.

In another embodiment, the insulating material extends directly over the diode structure and is provided with a window adjacent the upper surface of the diode structure through which an electrical contact layer extends and the semi-insulating semiconductor layer is provided over the insulating and contact layers. Thus, the semi-insulating semiconductor layer overlies the insulating material layer, where this is exposed, and the contact layer. Again, the contact layer, which can be of metal, may constitute the second conductive layer or, instead, the second conductive layer may be formed as a separately deposited layer over the surface of the diode structure.

According to another aspect of the present invention there is provided an active matrix display device comprising a pair of spaced substrates carrying opposing electrodes with electro-optic material, for example liquid crystal material, therebetween defining an array of display elements, the display element electrodes on one substrate being connected through diode devices to associated address conductors provided on that substrate, which is characterised in that the diode devices comprise thin film diode devices according to the first aspect of the invention.

BRIEF DESCRIPTION OF THE DRAWINGS

Diode devices and an active matrix display device incorporating such devices in accordance with the invention will now be described, by way of example, with reference to the accompanying drawings, in which.

DESCRIPTION OF THE PREFERRED EMBODIMENTS

Figure 1:
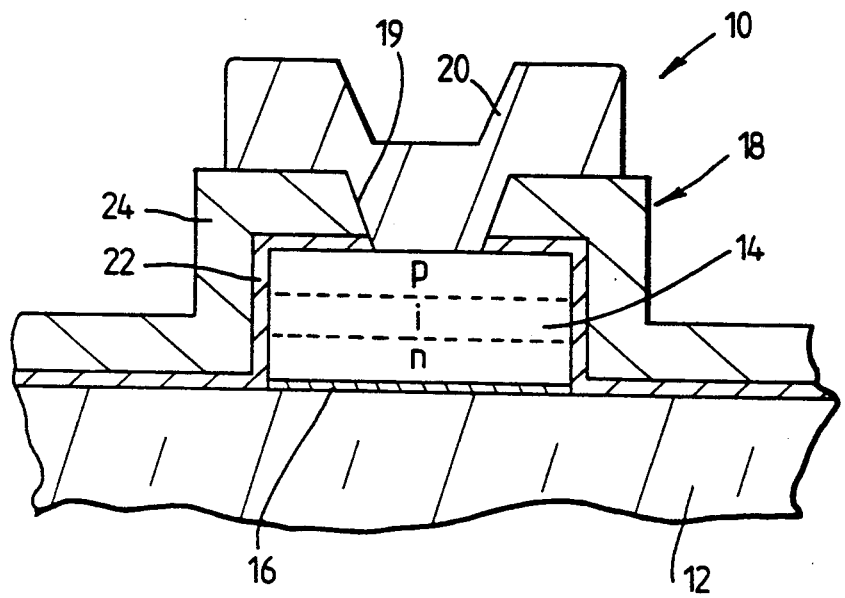
FIG. 1 is a schematic cross-sectional view, not to scale through an embodiment of a thin film diode device according to the invention.

Referring to FIG. 1, the thin film diode device 10, is fabricated on a transparent, insulative substrate 12, for example of glass, and comprises a diode structure 14, generally rectangular in plan view, consisting of amorphous silicon material suitably doped to provide a p-i-n sub-layer configuration. The order of the sub-layers can be reversed. The diode structure 14 overlies a substantially co-extensive lower conductive layer 16 of metal, for example tungsten, serving as a contact pad. The contact pad 16 is formed integrally with an extension (not visible) for connection purposes from a single deposited layer which extension extends over the surface of the substrate 12.

The diode structure 14 is surrounded by passivation material, generally referenced as 18, which covers the upstanding side surfaces of the diode structure and the upper surface of the structure apart from the region of an opening 19 through which an upper conductive layer 20 overlying the passivation material extends to contact the diode structure. The passivation material extends laterally of the diode structure over the adjacent substrate surface. The layer 20 is of metal, for example aluminium or chromium. Like the lower conductive layer 16, this layer 20 has an extension track (not visible) formed integrally with the layer 20 from a single deposited layer which runs over the surface of the passivation material 18 through which electrical connection with the layer 20 can be made.

The passivation material 18 consists of two separately deposited and directly superimposed layers. The first of these, referenced 22, comprises an insulator, in this particular example silicon nitride, which initially is deposited directly over the side and upper surface of the diode structure 14 and laterally adjacent regions of the substrate to a thickness of around 0.1 micrometer. Silicon dioxide, polyimide or another suitable insulative material could alternatively be used for the layer 22. This layer in turn is covered directly by a similarly extensive layer 24 of light-absorbing semi-insulating semiconductor material comprising undoped amorphous silicon material of a thickness around 0.25 to 0.5 micrometer. The two layers 22 and 24 initially surround and cover completely all exposed surfaces of diode structure 14 and thereafter a window is etched through the two layers over the upper surface of the diode structure to provide the opening 19. Standard deposition and definition techniques, as will be apparent to persons skilled in the art, are used for the device fabrication.

The semi-insulating semiconductor material of the layer 24 serves to absorb incident light rendering the layer 24 substantially opaque to light to which the diode device may be expected to be subjected in subsequent use. Because the semi-insulating semiconductor layer 24 and the diode structure 14 employ the same type of material, namely amorphous silicon, the semi-insulating semiconductor layer 24 serves to absorb particularly those wavelengths which are likely otherwise to be absorbed by, and cause photocurrents in, the diode structure 14 if allowed to reach this structure. Thus the layer 24 prevents such light reaching the structure 14, or at least substantially attenuates this light when incident thereon. Light absorbed in the layer 24 produces hole/electron pairs, primarily in the surface region of this layer, which subsequently recombine without significant migration.

The metal upper and lower conductive layers 16 and 20 also act to block light so that the diode structure 14 is completely surrounded by light shielding material.

The insulating layer 22 separates the semi-insulating semiconductor layer 24 from the diode structure 14 and provides the required electrical isolation while the electrical characteristics of the semi-insulating semiconductor material are such that no band bending, possibly giving rise to inversion or accumulation layers, is likely to occur in the diode structure 14 to affect its performance detrimentally.

In a modified form of this device, a conductive layer, not necessarily of metal, may be formed directly on the upper surface of the diode structure corresponding to the lower conductive layer 16 prior to forming the layers 22 and 24, the metal layer 20 then contacting this conductive layer through the opening 19.

It will be appreciated that other modifications are possible within the scope of the invention and that diode devices embodying the invention as defined in the appended claims may be of a form different from the specific embodiment described above. For example, the diode structure may be other than a p-i-n configuration. Also, component materials may be changed. For example, polycrystalline semiconductor material may be used for the diode structure.

Figure 2:
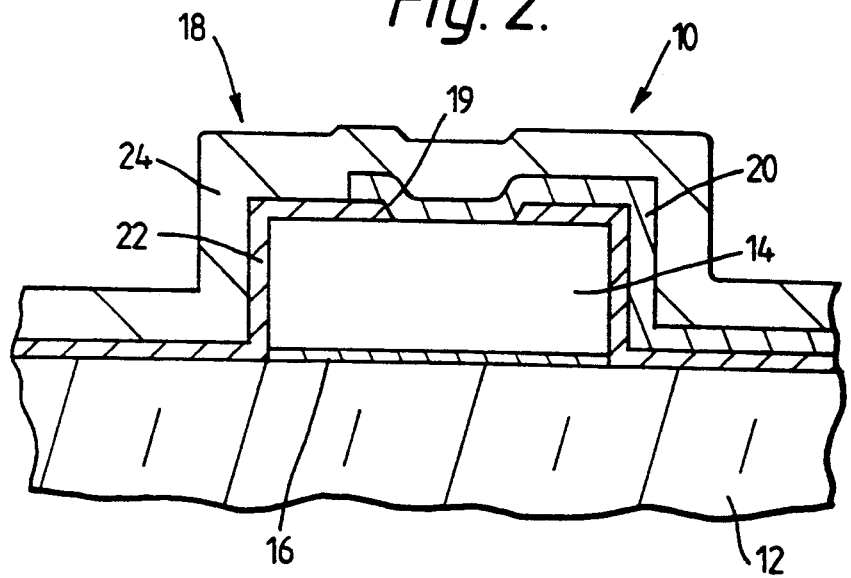
FIG. 2 is a similar view through another embodiment of a thin film diode device according to the invention.

Moreover, the construction of the diode device may also be changed. By way of illustration, FIG. 2 shows in section another embodiment of a diode device according to the invention employing a different construction. This embodiment has many similarities with the previous embodiment and, accordingly, the same reference numerals are used to designate corresponding components for simplicity. In this embodiment, the upper metal layer 20, here shown with an intregral extension track, is deposited and defined after deposition of the insulative layer 22 and formation of the window 19 through which the layer 20 contacts the diode structure 14 but prior to deposition of the semi-insulating semiconductor layer 24. The semi-insulating semiconductor layer 24 is provided after the metal layer 20 has been deposited and defined as a continuous layer covering all exposed surfaces over and around the diode structure. Again, therefore, the diode structure is shielded from light which might otherwise cause photocurrents by the semi-insulating semiconductor layer 24 in combination with the metal layer 20 where they are superimposed, and the lower metal contact pad 16 which covers the lower surface of the diode structure 14. As before, a further conductive layer may be provided on the upper surface of the diode structure with which the layer 20 contacts. Because the contact layer 20 is covered by the layer 24, it need not be formed of metal but could instead by formed of transparent conductive material such as ITO.

As in the previous embodiment, the above-described diode device construction leads to a reduction in photocurrent and hence a reduction in the magnitude of the reverse current.

Compared with a thin film diode device using only an insulative silicon nitride passivation layer, diode devices according to the invention using a p-i-n amorphous silicon diode structure configuration and an amorphous silicon semi-insulating semiconductor layer 24 have been found to reduce photosensitivity by a factor of five.

An array of discrete diode devices as described above can readily be fabricated simultaneously on a common substrate using standard layer deposition and photolithographic techniques. An active matrix liquid crystal display device utilizing such an array will now be described with reference to FIGS. 3 and 4. The embodiment hereinafter described uses a diode ring, consisting of two diode devices arranged in reverse parallel configuration, as a switching element for each individual display element in the device. It should be understood, however, that different diode device configurations may be used as described in the aforementioned patent specifications. Moreover, although p-i-n type diode devices are referred to in particular, it should be appreciated that other types can also be used.

Figure 3:
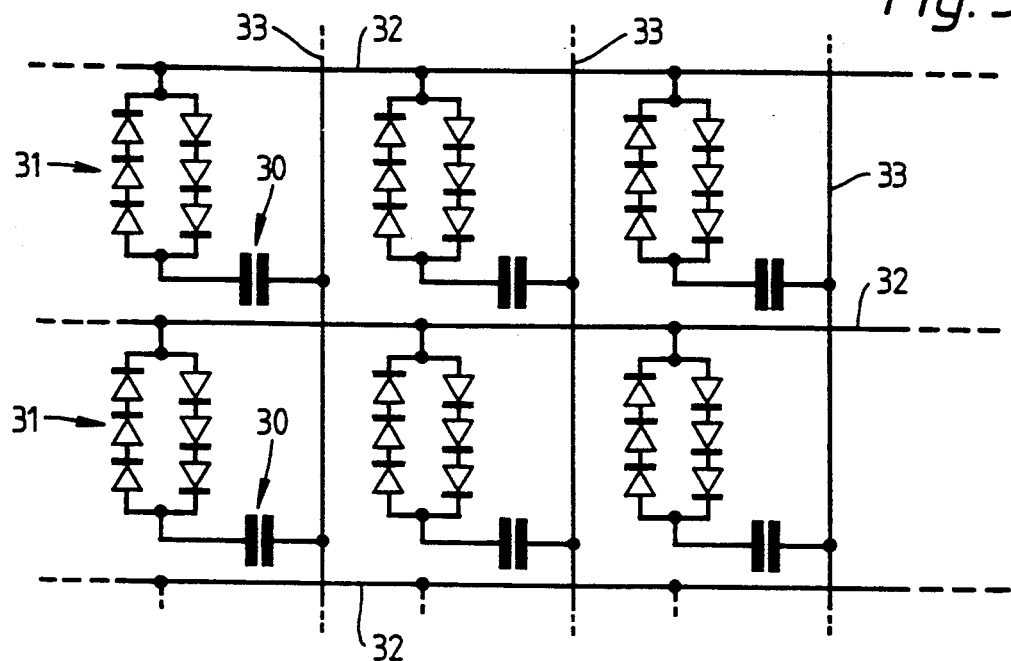
FIG. 3 is a schematic circuit diagram of a typical part of an active matrix liquid crystal display device according to the invention which uses thin film diode devices as switching elements for an array of display elements.

The display device resembles in most respects conventional diode ring addressed LC display devices which will be familiar to persons skilled in the art. FIG. 3 is a schematic circuit diagram of a few typical display elements, 30, and their associated diode rings, 31, in the device. Each display element 30 is connected in series with a diode ring consisting of two arms, each constituted by a diode device having three series-connected diode elements, connected in parallel opposition between respective row and column address conductors 32 and 33. The device may comprise 100,000 or more display element and be capable of displaying video, e.g. TV, pictures. To this end the display elements are addressed on a row at a time basis in conventional fashion with select signals applied to the row conductors and video data signals applied to the column conductors. Examples of diode ring addressed displays, their construction and operation, are described for example in B GB-A 2129183, to which reference is invited for further details.

Figure 4:
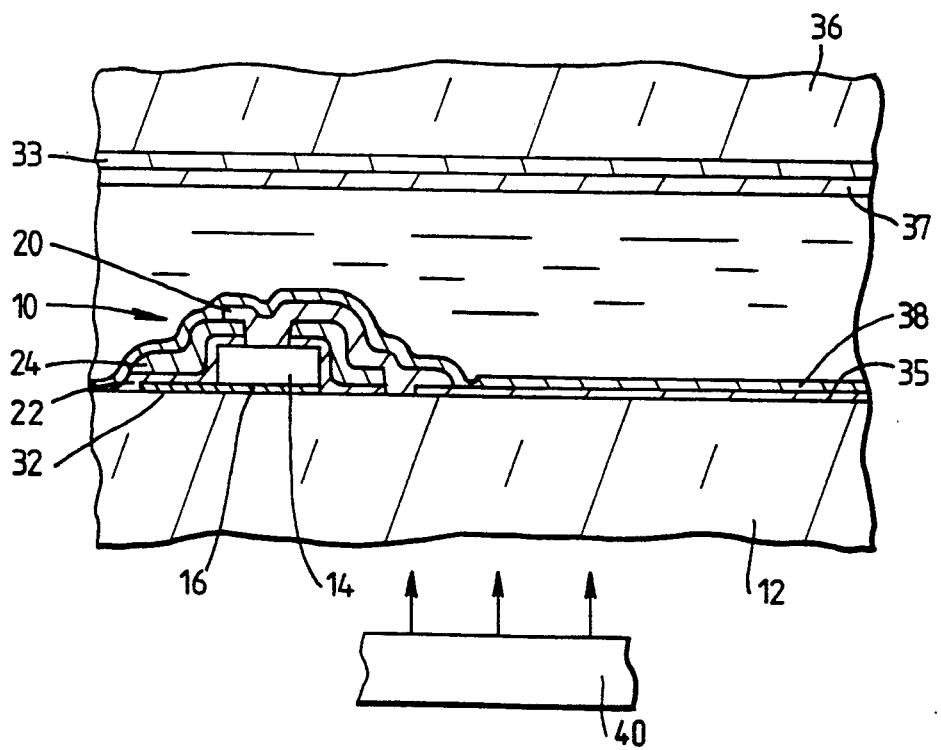
FIG. 4 is a schematic cross-section through a display element of the display device.

Referring to FIG. 4 there is shown schematically, and not to scale, a cross-section through one typical display element, in which only one of the two associated diode devices is visible. The display element includes a transparent electrode 35 of ITO carried on the substrate 12 to which the upper conductive layer 20 of the diode device 10 is connected via its integral extension track. In this embodiment, the diode structure 14 of each diode device 10 consists of three p-i-n structures stacked upon each other so as to form three series-connected diode elements. The opposing electrode of the display element is provided by a corresponding portion of an associated, transparent, column address conductor 33 carried on a second, spaced, substrate, again for example of glass. The column conductors are covered by a continuous protection/alignment film 37 of a polyimide material. Likewise, the electrode 35, diode devices 10 and address conductors 32 on the other substrate 12 are covered by a similar film 38. The space between the two films 37 and 38 is filled with liquid crystal material.

The conductive layer 16 of the diode device 10 comprises a part of an extension formed integrally with the row address conductor 32.

The other diode device, again having a diode structure consisting of three series-connected diode elements, associated with this display element is connected in similar manner between the electrode 35 and address conductor 32 but in the opposite sense with its upper and lower conductive layers 20 and 16 connected respectively to the row conductor 32 and the display element electrode 35 so as to provide the necessary reverse configuration.

The insulating layers 22 of the diode devices 10 may comprise portions of a single layer extending continuously over the surface of the substrate 12, and beneath the electrodes 35. The semi-insulating semiconductor layers 24 of the diode devices 10 are formed from a single deposited layer which is defined so as to separate physically the layer 24 of each device from those of its neighbours, as is shown in FIG. 4.

Diode devices of the configuration shown in FIG. 2 may, of course, be used in this display device. Also, the diode devices need not be of a p-i-n type. Instead the diode structure 14 could be a n-i-n configuration. Such a device has a bidirectional, and generally symmetrical, characteristic and can therefore be used singly with a display element.

The display device further includes a source of light, generally represented at 40, whose light is directed through the substrate 12 to illuminate the display elements. The light source may alternatively be positioned adjacent the other substrate 36.

We claim:

1. A thin film diode device comprising on a substrate a first conductive layer, a diode structure and a second conductive layer, the first and second conductive layers contacting at least a portion of opposing surfaces of the diode structure, and passivation material at least partly surrounding the diode structure and comprising a layer of insulating material, characterised in that the passivation material further includes a layer of semi-insulating semiconductor material, the layer of insulating material extending between the diode structure and the semi-insulating semiconductor layer.

2. A thin film diode device according to claim 1, characterised in that the conductive layers and the semi-insulating semiconductor layer comprise opaque material and together surround substantially completely the diode structure.

3. A thin film diode device according to claim 1, characterised in that the layer of insulating material is provided directly on the surface of the diode structure and that the semi-insulating semiconductor layer directly contacts the insulating layer.

4. A thin film diode device according to claim 1, characterised in that the diode structure comprises amorphous semiconductor material.

5. A thin film diode device according to claim 4, characterised in that the diode structure comprises amorphous silicon material.

6. A thin film diode device according to claim 1, characterised in that the semi-insulating semiconductor material comprises the same material as the diode structure.

7. A thin film diode device according to claim 1, characterised in that the first conductive layer extends over the surface of the substrate and the diode structure and second conductive layer overlie the first conductive layer.

8. A thin film diode device according to claim 7, characterised in that the insulating layer and the semi-insulating semiconductor layer extend over the upper and side surfaces of the diode structure and in that a window is provided in these layers adjacent the upper side of the diode structure through which a metal contact layer extends.

9. A thin film diode device according to claim 7, characterised in that the insulating material extends directly over the diode structure and is provided with a window over the upper side of the diode structure through which an electrical contact layer extends and in that the semi-insulating semiconductor layer is provided over the insulating layer and the electrical contact layer.

10. An active matrix display device comprising a pair of spaced substrates carrying opposing electrodes with electro-optic material therebetween defining an array of display elements, the display element electrodes on one of the substrates being connected through diode devices to address conductors provided on that substrate, characterised in that the diode devices comprise thin film diode devices according to any one of Claim 1.

11. An active matrix display device according to Claim 10, characterised in that the electro-optic material comprises liquid crystal material and in that the device further includes a light source adjacent one substrate for illuminating the display elements.

12. A thin film diode device according to claim 2, characterized in that the layer of insulating material is provided directly on the surface of the diode structure and that the semi-insulating semiconductor layer directly contacts the insulating layer.

13. A thin film diode device according to claim 2, characterized in that the diode structure comprises amorphous simiconductor material.

14. A thin film diode device according to claim 3, characterized in that the diode structure comprises amorphous semiconductor material.

15. A thin film diode device according to claim 2, characterized in that the semi-insulating semiconductor material comprises the same material as the diode structure.

16. A thin film diode device according to claim 3, characterized in that the semi-insulating semiconductor material comprises the same material as the diode structure.

17. A thin film diode device according to claim 4, characterized in that the semi-insulating semiconductor material comprises the same material as the diode structure.

18. A thin film diode device according to claim 5, characterized in that the semi-insulating semiconductor material comprises the same material as the diode structure.

19. A thin film diode device according to claim 2, characterized in that the first conductive layer extends over the surface of the substrate and the diode structure and second conductive layer overlie the first conductive layer.

20. A thin film diode device according to claim 3, characterized in that the first conductive layer extends over the surface of the substrate and the diode structure and second conductive layer overlie the first conductive layer.

21. A thin film diode device according to claim 4, characterized in that the first conductive layer extends over the surface of the substrate and the diode structure and second conductive layer overlie the first conductive layer.

22. A thin film diode device according to claim 5, characterized in that the first conductive layer extends over the surface of the substrate and the diode structure and second conductive layer overlie the first conductive layer.

23. A thin film diode device according to claim 6, characterized in that the first conductive layer extends over the surface of the substrate and the diode structure and second conductive layer overlie the first conductive layer.

24. An active matrix display device comprising a pair of spaced substrates carrying opposing electrodes with electro-optic material therebetween defining an array of display elements, the display element electrodes on one of the substrates being connected through diode devices to address conductors provided on that substrate, characterized in that the diode devices comprise thin film diode devices according to claim 2.

25. An active matrix display device comprising a pair of spaced substrates carrying opposing electrodes with electro-optic material therebetween defining an array of display elements, the display element electrodes on one of the substrates being connected through diode devices to address conductors provided on that substrate, characterized in that the diode devices comprise thin film diode devices according to claim 3.

26. An active matrix display device comprising a pair of spaced substrates carrying opposing electrodes with electro-optic material therebetween defining an array of display elements, the display element electrodes on one of the substrates being connected through diode devices to address conductors provided on that substrate, characterized in that the diode devices comprise thin film diode devices according to claim 4.

27. An active matrix display device comprising a pair of spaced substrates carrying opposing electrodes with electro-optic material therebetween defining an array of display elements, the display element electrodes on one of the substrates being connected through diode devices to address conductors provided on that substrate, characterized in that the diode devices comprise thin film diode devices according to claim 5.

28. An active matrix display device comprising a pair of spaced substrates carrying opposing electrodes with electro-optic material therebetween defining an array of display elements, the display element electrodes on one of the substrates being connected through diode devices to address conductors provided on that substrate, characterized in that the diode devices comprise thin film diode devices according to claim 6.

29. An active matrix display device comprising a pair of spaced substrates carrying opposing electrodes with electro-optic material therebetween defining an array of display elements, the display element electrodes on one of the substrates being connected through diode devices to address conductors provided on that substrate, characterized in that the diode devices comprise thin film diode devices according to claim 7.

30. An active matrix display device comprising a pair of spaced substrates carrying opposing electrodes with electro-optic material therebetween defining an array of display elements, the display element electrodes on one of the substrates being connected through diode devices to address conductors provided on that substrate, characterized in that the diode devices comprise thin film diode devices according to claim 8.

31. An active matrix display device comprising a pair of spaced substrates carrying opposing electrodes with electro-optic material therebetween defining an array of display elements, the display element electrodes on one of the substrates being connected through diode devices to address conductors provided on that substrate, characterized in that the diode devices comprise thin film diode devices according to claim 9.

32. An active matrix display device according to claim 24, characterized in that the electro-optic material comprises liquid crystal material and in that the device further includes a light source adjacent one substrate for illuminating the display elements.

33. An active matrix display device according to claim 25, characterized in that the electro-optic material comprises liquid crystal material and in that the device further includes a light source adjacent one substrate for illuminating the display elements.

34. An active matrix display device according to claim 26, characterized in that the electro-optic material comprises liquid crystal material and in that the device further includes a light source adjacent one substrate for illuminating the display elements.

35. An active matrix display device according to claim 27, characterized in that the electro-optic material comprises liquid crystal material and in that the device further includes a light source adjacent one substrate for illuminating the display elements.

36. An active matrix display device according to claim 28, characterized in that the electro-optic material comprises liquid crystal material and in that the device further includes a light source adjacent one substrate for illuminating the display elements.

37. An active matrix display device according to claim 29, characterized in that the electro-optic material comprises liquid crystal material and in that the device further includes a light source adjacent one substrate for illuminating the display elements.

38. An active matrix display device according to claim 30, characterized in that the electro-optic material comprises liquid crystal material and in that the device further includes a light source adjacent one substrate for illuminating the display elements.

39. An active matrix display device according to claim 31, characterized in that the electro-optic material comprises liquid crystal material and in that the device further includes a light source adjacent one substrate for illuminating the display elements.

* * * * *